US011185815B2

(12) United States Patent
Cox et al.

(10) Patent No.: US 11,185,815 B2
(45) Date of Patent: *Nov. 30, 2021

(54) PLASMA ABATEMENT OF COMPOUNDS CONTAINING HEAVY ATOMS (71) Applicant: Applied Materials, Inc., Santa Clara, CA (US)

(72) Inventors: Michael S. Cox, Gilroy, CA (US); Monique McIntosh, San Jose, CA (US); Colin John Dickinson, San Jose, CA (US); Paul E. Fisher, Los Altos, CA (US); Yutaka Tanaka, San Jose, CA (US); Zheng Yuan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/030,337

(22) Filed: Jul. 9, 2018

(65) Prior Publication Data

US 2018/0318758 A1 Nov. 8, 2018

Related U.S. Application Data (60) Continuation of application No. 15/486,938, filed on Apr. 13, 2017, now Pat. No. 10,449,486, which is a division of application No. 14/638,871, filed on Mar. 4, 2015, now Pat. No. 9,649,592.

(60) Provisional application No. 62/053,698, filed on Sep. 22, 2014, provisional application No. 61/949,160, filed on Mar. 6, 2014.

(51) Int. Cl.
| | |
|---|---|
| *H05H 1/24* | (2006.01) |
| *B01D 53/32* | (2006.01) |
| *B01D 53/64* | (2006.01) |
| *B01D 53/70* | (2006.01) |
| *B01D 53/76* | (2006.01) |
| *B01J 19/08* | (2006.01) |
| *H01J 37/32* | (2006.01) |
| *B01D 53/54* | (2006.01) |

(52) U.S. Cl.
CPC .......... *B01D 53/32* (2013.01); *B01D 53/54* (2013.01); *B01D 53/64* (2013.01); *B01D 53/70* (2013.01); *B01D 53/76* (2013.01); *B01J 19/088* (2013.01); *H01J 37/321* (2013.01); *H01J 37/3244* (2013.01); *H01J 37/32091* (2013.01); *H01J 37/32522* (2013.01); *H01J 37/32669* (2013.01); *H05H 1/24* (2013.01); *H05H 1/473* (2021.05); *B01D 2251/00* (2013.01); *B01D 2251/10* (2013.01); *B01D 2251/102* (2013.01); *B01D 2251/104* (2013.01); *B01D 2251/108* (2013.01); *B01D 2251/20* (2013.01); *B01D 2251/202* (2013.01); *B01D 2251/204* (2013.01); *B01D 2251/208* (2013.01); *B01D 2251/2062* (2013.01); *B01D 2251/502* (2013.01); *B01D 2252/103* (2013.01); *B01D 2257/55* (2013.01); *B01D 2257/553* (2013.01); *B01D 2257/556* (2013.01); *B01D 2257/60* (2013.01); *B01D 2257/7025* (2013.01); *B01D 2257/93* (2013.01); *B01D 2258/0216* (2013.01); *B01D 2259/818* (2013.01); *B01J 2219/0815* (2013.01); *B01J 2219/0875* (2013.01); *B01J 2219/0894* (2013.01); *H01J 2237/002* (2013.01); *H01J 2237/335* (2013.01); *Y02C 20/20* (2013.01); *Y02C 20/30* (2013.01)

(58) Field of Classification Search
None
See application file for complete search history.

(56) References Cited

U.S. PATENT DOCUMENTS

| | | | |
|---|---|---|---|
| 5,108,718 A | 4/1992 | Dummersdorf et al. | |
| 5,238,656 A | 8/1993 | Tajima et al. | |

(Continued)

FOREIGN PATENT DOCUMENTS

| | | |
|---|---|---|
| CN | 101061256 A | 10/2007 |
| CN | 101194046 A | 6/2008 |

(Continued)

OTHER PUBLICATIONS

Japan Office Action dated Feb. 26, 2019 for Application No. 2016-553498.
Office Action from Korean Patent Application No. 10-2018-7018712 dated Nov. 20, 2019.
X P. Xu et al. "Plasma abatement of perfluorocompounds in inductively coupled plasma reactors", Journal of Vacuum Science & Technology A, 2000, vol. 18,pp. 213-231.
International Search Report and Written Opinion in related application PCT/2015/016634 dated May 29, 2015.
U.S. Non-Final Office Action in related U.S. Appl. No. 14/638,871 dated Jun. 30, 2016.

(Continued)

*Primary Examiner* — Sheng H Davis
(74) *Attorney, Agent, or Firm* — Patterson + Sheridan, LLP (57) ABSTRACT A plasma abatement process for abating effluent containing compounds from a processing chamber is described. A plasma abatement process takes gaseous foreline effluent from a processing chamber, such as a deposition chamber, and reacts the effluent within a plasma chamber placed in the foreline path. The plasma dissociates the compounds within the effluent, converting the effluent into more benign compounds. Abating reagents may assist in the abating of the compounds. The abatement process may be a volatizing or a condensing abatement process. Representative volatilizing abating reagents include, for example, $CH_4$, $H_2O$, $H_2$, $NF_3$, $SF_6$, $F_2$, HCl, HF, $Cl_2$, and HBr. Representative condensing abating reagents include, for example, $H_2$, $H_2O$, $O_2$, $N_2$, $O_3$, CO, $CO_2$, $NH_3$, $N_2O$, $CH_4$, and combinations thereof.

16 Claims, 5 Drawing Sheets

(56) References Cited

U.S. PATENT DOCUMENTS

| | | |
|---|---|---|
| 6,576,573 B2 | 6/2003 | Arno |
| 6,896,775 B2 | 5/2005 | Chistyakov |
| 6,905,663 B1 | 6/2005 | Arno |
| 2004/0182516 A1 | 9/2004 | Lindley et al. |
| 2005/0274396 A1 | 12/2005 | Shih et al. |
| 2011/0135552 A1* | 6/2011 | Dickinson .............. B01D 53/32 423/235 |
| 2012/0001550 A1* | 1/2012 | Chang ............... H01J 37/32678 315/111.41 |
| 2013/0177473 A1* | 7/2013 | Albrecht .............. H05H 1/2406 422/22 |
| 2013/0213574 A1 | 8/2013 | Sankarakrishnan et al. |

FOREIGN PATENT DOCUMENTS

| | | | |
|---|---|---|---|
| CN | 102067279 A | | 5/2011 |
| CN | 102473595 A | | 5/2012 |
| DE | 102005032320 A1 | | 1/2007 |
| EP | 1145759 | * | 12/1996 |
| JP | 200218237 A | | 1/2002 |
| JP | 2002355295 A | | 12/2002 |
| JP | 2003340454 A | | 12/2003 |
| JP | 2005536890 A | | 12/2005 |
| JP | 2009501073 A | | 1/2009 |
| JP | 2009540126 A | | 11/2009 |
| JP | 2010022991 A | | 2/2010 |
| JP | 2010523326 A | | 7/2010 |
| JP | 2012196621 A | | 10/2012 |
| KR | 20120050396 A | | 5/2012 |
| TW | 550634 B | | 9/2003 |
| WO | 2012017972 A1 | | 2/2012 |

OTHER PUBLICATIONS

Korean Office Action dated Oct. 30, 2017 for Application No. 10-2016-7022238.
Japan Office Action dated Mar. 5, 2020 for Application No. 2016-553498.
Chinese Office Action dated Aug. 23, 2018 for Application No. 201580003949.X.
Japan Office Action dated Sep. 15, 2021 for Application No. 2020-116103.

* cited by examiner

PLASMA ABATEMENT OF COMPOUNDS CONTAINING HEAVY ATOMS

CROSS-REFERENCE TO RELATED APPLICATIONS

This application is a continuation of and claims benefit to U.S. patent application Ser. No. 15/486,938, filed on Apr. 13, 2017, which is a divisional of U.S. patent application Ser. No. 14/638,871, filed on Mar. 4, 2015, now U.S. Pat. No. 9,649,592, which claims priority to U.S. Provisional Patent Application Ser. No. 61/949,160, filed on Mar. 6, 2014 and U.S. Provisional Patent Application Ser. No. 62/053,698, filed on Sep. 22, 2014, all of which are hereby incorporated by reference in their entirety.

BACKGROUND

Field

Embodiments of the present disclosure generally relate to abatement for semiconductor processing equipment. More particularly, embodiments of the present disclosure relate to techniques for abating compounds present in the effluent of semiconductor processing equipment.

Description of the Related Art

Effluent produced during semiconductor manufacturing processes includes many compounds which must be abated or treated before disposal, due to regulatory requirements and environmental and safety concerns. Among these compounds are perfluorocarbons (PFCs), which are used, for example, in etching processes. Remote plasma sources (RPS) or in-line plasma sources (IPS) have been used for abatement of PFCs and global warming gases. However, the design of current abatement technology for abating other gases used in semiconductor processing, such as gases containing heavy atoms and particulate matter generated therefrom is inadequate. Such gases and particulate matter are harmful to both human health and the environment, along with being harmful to semiconductor processing equipment, such as processing pumps.

Accordingly, what is needed in the art is an improved abatement method.

SUMMARY

Embodiments disclosed herein include a system for abating effluent from a processing chamber. The system includes a magnetically enhanced plasma source coupled to a foreline of a processing chamber. The processing chamber is a deposition chamber. The system also includes a reagent source positioned upstream of the plasma source and coupled with the plasma source. The reagent source is configured to deliver an abating reagent to the plasma source.

In one embodiment, an apparatus for abating effluent from a processing chamber is provided. The apparatus includes a plasma source coupled to a foreline of a deposition chamber, the plasma source comprising a first plate having an outer edge and an inner edge, a second plate parallel to the first plate, wherein the second plate has an outer edge and an inner edge, an outer wall disposed between the outer edges of the first and second plates, an electrode disposed between the inner edges of the first and second plates, a first plurality of magnets disposed on the first plate, and a second plurality of magnets disposed on the second plate, and a reagent source positioned upstream of the plasma source, wherein the reagent source is coupled with the plasma source, and wherein the reagent source is configured to deliver an abating reagent to the plasma source, the abating reagent selected from the group comprising $BCl_3$, $CCl_4$, $SiCl_4$, $NF_3$, $SF_4$, $SF_6$, $SF_8$, a reducing compound, a halogenated etching compound, $CH_4$, $H_2$, $F_2$, HCl, HF, $Cl_2$, HBr, $O_2$, $N_2$, $O_3$, CO, $CO_2$, $NH_3$, $N_2O$, $CH_4$, and combinations thereof.

In another embodiment, the apparatus includes a plasma source coupled to a gas line of a deposition chamber, the plasma source comprising a first plate having an outer edge and an inner edge, a second plate parallel to the first plate, wherein the second plate has an outer edge and an inner edge, an inner wall disposed between the inner edges of the first and second plates, wherein the first plate and the second plate are concentric with the inner wall, an outer wall disposed between the outer edges of the first and second plates, the first plate, the second plate, the inner wall and the outer wall defining a plasma region, a first plurality of magnets disposed on the first plate, and a second plurality of magnets disposed on the second plate, and a reagent source positioned upstream of the plasma source, wherein the reagent source is coupled with the plasma source, and wherein the reagent source is configured to deliver an abating reagent to the plasma source.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments disclosed herein include a plasma abatement process for materials present in an effluent exiting a processing chamber. A plasma abatement process takes foreline effluent from a processing chamber, such as a deposition chamber, an etch chamber or other vacuum processing chamber, and reacts the effluent within a plasma chamber placed in the foreline path. The plasma energizes the materials present in the effluent, making conversion of the material into a more benign form more efficient. In some embodiments, the plasma may at least partially dissociate the materials present within the effluent, which increases the efficiency of the conversion of the materials within the effluent into more benign forms. An abating reagent may assist in the abating of the materials present within the effluent. The abatement process may be a volatilizing or a condensing abatement process.

A volatilizing abatement process converts materials, such as $SiF_x$, which can form $SiO_2$, into gaseous species that will not form solids within a vacuum pump downstream of the abatement process. An abating reagent that may be used in a volatizing abatement process is referred to herein as a volatilizing abating reagent. Representative volatilizing abating reagents include, for example, $CH_4$, $H_2O$, $H_2$, $NF_3$, $SF_6$, $F_2$, HCl, HF, $Cl_2$, and HBr. Representative volatilizing abating reagents also include a combination of $CH_xF_y$, and $O_2$ and/or $H_2O$, and a combination of $CF_x$ and $O_2$ and/or $H_2O$. A condensing abatement process converts materials within the effluent into solids, and traps the converted solids so that the solids do not reach the vacuum pump. An abating reagent that may be used in a condensing abatement process is referred to herein as a condensing abating reagent. Representative condensing abating reagents include, for example, $H_2$, $H_2O$, $O_2$, $N_2$, $O_3$, CO, $CO_2$, $NH_3$, $N_2O$, $CH_4$, and combinations thereof.

Figure 1:
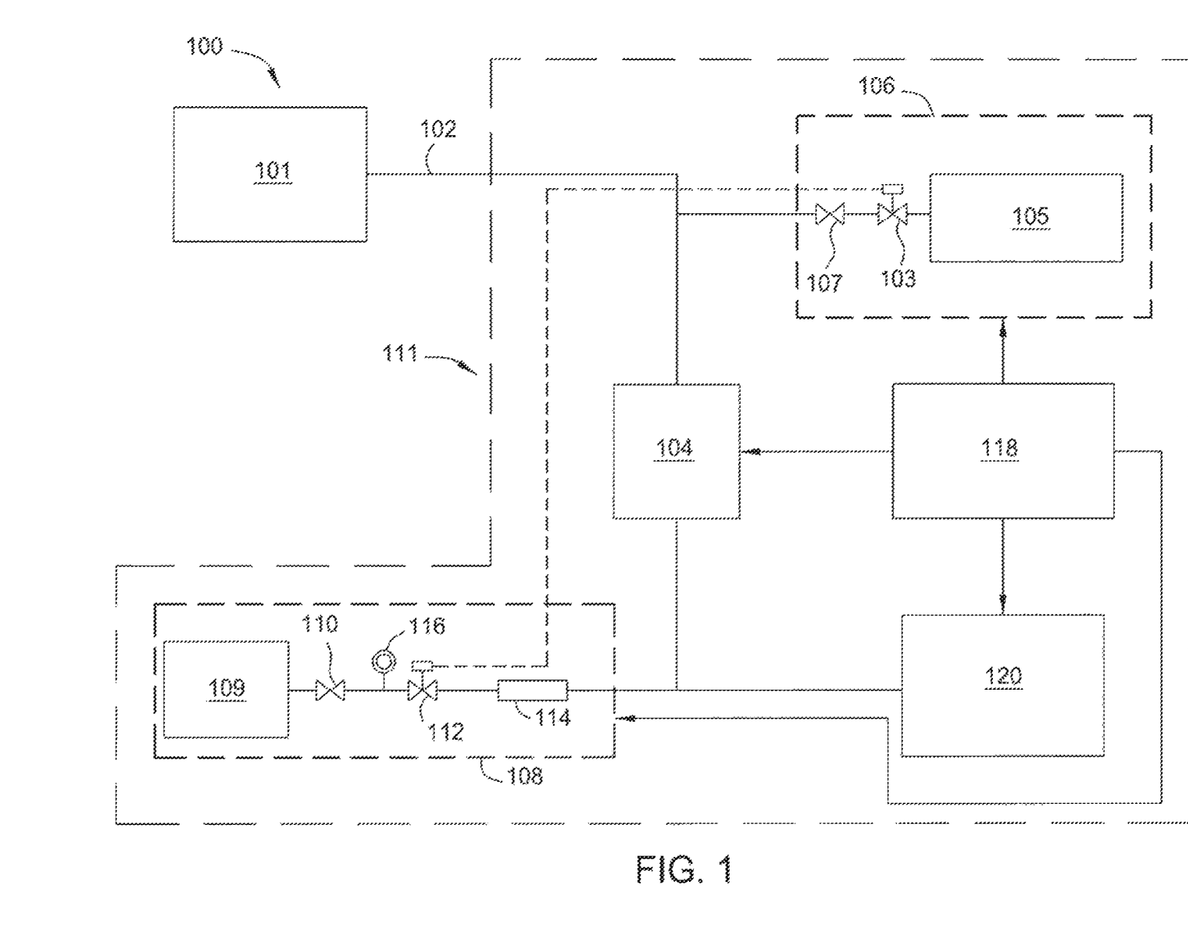
FIG. 1 depicts a schematic diagram of a substrate processing system in accordance with some embodiments.

FIG. 1 depicts a schematic diagram of a processing system 100 in accordance with the embodiments disclosed herein. As shown in FIG. 1, a foreline 102 couples a processing chamber 101 with an abatement system 111. The processing chamber 101 may be, for example, a processing chamber for carrying out a deposition process, an etching process, annealing or a cleaning process, among others. Representative chambers for carrying out a deposition process include deposition chambers, such as, for example, plasma enhanced chemical vapor deposition (PECVD) chambers, chemical vapor deposition (CVD) chambers, or physical vapor deposition (PVD) chambers. In some embodiments, the deposition process may be one that deposits dielectrics, such as silicon dioxide, ($SiO_2$), silicon nitride ($SiN_x$), silicon oxynitride (SiON), crystalline silicon, a-Si, doped a-Si, fluorinated glass (FSG), phosphorous doped glass (PSG), boron-phosphorous doped glass (BPSG), carbon-doped glass, and other low-k dielectrics, such as polyimides and organosiloxanes. In other embodiments, the deposition process may be one that deposits metals, metal oxides, or metal nitrides, such as, for example, titanium, titanium dioxide, tungsten, tungsten nitride, tantalum, tantalum nitride, tantalum carbide, aluminum, aluminum oxide, aluminum nitride, ruthenium, or cobalt. In addition, metal alloys may be deposited, such as lithium-phosphorous-oxynitride, lithium-cobalt, and many others.

Foreline 102 serves as a conduit that routes effluent leaving the processing chamber 101 to the abatement system 111. The effluent may contain material which is undesirable for release into the atmosphere or may damage downstream equipment, such as vacuum pumps. For example, the effluent may contain compounds from a dielectric deposition process or from a metal deposition process.

Examples of materials present in the effluent that may be abated using the methods disclosed herein includes compounds having a heavy atom as the central atom, or if there is no central atom, as one of the two most central atoms (i.e., Si in disilane ($H_3Si$—$SiH_3$)). As used herein, a "heavy atom" includes atoms heavier than boron, such as, for example, Al, Si, W, and Ti. In some embodiments, the effluent may contain compounds wherein the heavy atoms are at least as heavy as aluminum. In other embodiments, the effluent may contain compounds wherein the heavy atoms are at least as heavy as carbon. In other embodiments, the effluent may contain compounds wherein the heavy atoms are at least as heavy as silicon. In some embodiments, the effluent may contain metal compounds. In some embodiments, the effluent may not have a heavy atom as the central atom. In some embodiments, the effluent may be free or substantially free of fluorocarbons, such as hydrofluorocarbons (HFCs) and chlorofluorocarbons (CFCs).

Examples of silicon-containing materials present in the effluent that may be abated using the methods disclosed herein include, for example, silicon oxide (SiO), silicon dioxide ($SiO_2$), silane ($SiH_4$), disilane, silicon tetrachloride ($SiCl_4$), silicon nitride ($SiN_x$), dichlorosilane ($SiH_2Cl_2$), hexachlorodisilane ($Si_2Cl_4$), bis(t-butyl amino)silane, trisilylamine, disilylmethane, trisilylmethane, tetrasilylmethane, and tetraethyl orthosilicate (TEOS) ($Si(OEt)_4$). Other examples of silicon-containing materials include disiloxanes, such as disiloxane ($SiH_3OSiH_3$), trisiloxane ($SiH_3OSiH_2OSiH_3$), tetrasiloxane ($SiH_3OSiH_2OSiH_2OSiH_3$), and cyclotrisiloxane (—$SiH_2OSiH_2OSiH_2O$—). Examples of tungsten-containing materials present in the effluent that may be abated using the methods disclosed herein include, for example, $W(CO)_6$, $WF_6$, $WCl_6$, or $WBr_6$. Examples of titanium-containing materials present in the effluent that may be abated using the methods disclosed herein include, for example, $TiCl_4$ and $TiBr_4$. Examples of aluminum-containing materials present in the effluent that may be abated using the methods disclosed herein include, for example, trimethyl aluminum or triethylaluminum. Examples of other materials present in the effluent that may be abated using the methods disclosed herein include stibine ($SbH_3$), germane ($GH_4$), hydrogen telluride, and carbon-containing compounds, such as $CH_4$ and higher order alkanes.

On abatement system 111 that may be modified to benefit from the invention is a ZFP2™ abatement system available from Applied Materials, Inc., located in Santa Clara, Calif., among other suitable systems. As shown, the abatement system 111 includes a plasma source 104, a reagent delivery system 106, a foreline gas injection kit 108, a controller 118, and a vacuum source 120. Foreline 102 provides effluent leaving the processing chamber 101 to the plasma source 104. The plasma source 104 may be any plasma source coupled to the foreline 102 suitable for generating a plasma therein. For example, the plasma source 104 may be a remote plasma source, an in-line plasma source, or other suitable plasma source for generating a plasma within the foreline 102 or proximate the foreline 102 for introducing reactive species into the foreline 102. The plasma source 104 may be, for example, an inductively coupled plasma source, a capacitively coupled plasma source, a direct current plasma source, or a microwave plasma source. The plasma source 104 may further be a magnetically enhanced plasma source of any kind described above. In one embodiment, the plasma source 104 is a plasma source as described with reference to FIGS. 2A-2C.

A reagent delivery system 106 may also be coupled with the foreline 102. The reagent delivery system 106 delivers one or more reagents, such as abating reagents (which may be, for example, volatilizing or condensing abating reagents), to the foreline 102 upstream of the plasma source 104. In an alternative embodiment, the reagent delivery system 106 may be coupled directly to the plasma source 104 for delivering reagents directly into the plasma source 104. The reagent delivery system 106 may include a reagent source 105 (or multiple reagent sources (not shown)) coupled to the foreline 102 (or the plasma source 104) via one or more valves. For example, in some embodiments, a valve scheme may include a two-way control valve 103, which functions as an on/off switch for controlling the flow the one or more reagents from the reagent source 105 into the foreline 102, and a flow control device 107, which controls the flow rates of the one or more reagents into the foreline 102. The flow control device 107 may be disposed between the foreline 102 and the control valve 103. The control valve 103 may be any suitable control valve, such as a solenoid valve, pneumatic valve or the like. The flow control device 107 may be any suitable active or passive flow control device, such as a fixed orifice, mass flow controller, needle valve or the like.

A representative volatizing abating reagent that may be delivered by the reagent delivery system 106 includes, for example, $H_2O$. $H_2O$ may be used when abating effluent containing, for example, $CF_4$ and/or other materials. Another representative volatilizing reagent includes ammonia ($NH_3$). In other embodiments, the volatizing abating reagent may be $H_2$. $H_2$ may be used, for example, when abating effluent containing $H_2O_2$ and/or other materials. In other embodiments, the volatilizing abating reagent may be at least one or more of $BCl_3$, $CCl_4$, $SiCl_4$, $NF_3$, $SF_4$, $SF_6$, $SF_8$, other reducing or halogenated etching compounds, or combinations thereof. Reducing or halogenated etching compounds may be used, for example, when abating effluent containing $SiH_x$, SiO, Al, CO, and/or other materials. In still other embodiments, the volatilizing abating reagent may be a combination of $CH_xF_y$ and $O_2$ and/or $H_2O$. A combination of $CH_xF_y$ and $O_2$ and/or $H_2O$ may be used, for example, when abating effluent containing chlorine, $TiCl_4$, and/or other materials. In other embodiments, the volatilizing abating reagent may be a combination of $CF_x$ and $O_2$ and/or $H_2O$; a combination of $C_xCl_yF_z$ and $O_2$ and/or $H_2O$; or a combination of other freons with $O_2$ and/or $H_2O$. A combination of $CF_x$ and $O_2$ and/or $H_2O$; a combination of $C_xCl_yF_z$ and $O_2$ and/or $H_2O$; or a combination of other freons with $O_2$ and/or $H_2O$ may be used, for example, when abating effluent containing SiO, $SiH_x$, $NH_y$, $NO_x$, and/or other materials. In other embodiments, the volatizing abating reagent may be a halogen, such as $NF_3$, $F_2$, $Cl_2$, $Br_2$, $I_2$, or combinations thereof. Halogens may be used, for example, when abating effluent containing $TiCl_4$, trimethylamine, triethyl aluminum, and/or other materials. In other embodiments, the volatizing abating reagent may be hydrogen halides, such as HCl, HF, HBr, HI, or combinations thereof. Hydrogen halides may be used, for example, when abating effluent containing SiO, $SiN_x$, $SiH_y$, $SiO_2$, and/or other materials. In other embodiments, the volatilizing abating reagent may be methane or higher order alkanes. Methane or higher order alkanes may be used, for example, when abating effluent containing chlorine and/or other materials. In still other embodiments, the volatilizing abating reagent may be combinations of any number of any of the above-listed volatizing abating reagents. In some embodiments, the volatilizing abating reagents may be consumed by the compounds of the effluent, and therefore, may not be considered catalytic.

A representative condensing abating reagent that may be delivered by the reagent delivery system 106 includes, for example, $H_2O$. $H_2O$ may be used for example, when abating effluent containing $SiH_x$, $SiF_x$, $CxF_y$ and/or other materials. In other embodiments, the condensing abating reagent may be $H_2$. $H_2$ may be used, for example, when abating effluent containing $NH_xF_y$, $NH_x$, $F_y$, $F_2$ (such as when used to make ammonium salts) and/or other materials. In other embodiments, the condensing abating reagent may be $O_2$, $N_2$, $O_3$, CO, $CO_2$, $NH_3$, $N_2O$, other oxidizers, and combinations thereof. Oxidizers may be used, for example, when abating effluent containing materials heavier than carbon. In other embodiments, the condensing abating reagent may be alkanes, such as methane, ethane, propane, butane, isobutane, other alkanes, or combinations thereof. Alkanes may be used, for example, when abating effluent containing chlorine, aluminum, fluorine, and/or other materials. In still other embodiments, the condensing abating reagents may be combinations of any number of any of the above-listed condensing abating reagents. In some embodiments, the condensing abating reagents may be consumed by the compounds of the effluent, and therefore, may not be considered catalytic.

A foreline gas injection kit 108 may also be coupled to the foreline 102 upstream or downstream of the plasma source 104 (downstream depicted in FIG. 1). The foreline gas injection kit 108 may controllably provide a foreline gas, such as nitrogen ($N_2$), argon (Ar), or clean dry air, into the foreline 102 to control the pressure within the foreline 102. The foreline gas injection kit 108 may include a foreline gas source 109 followed by a pressure regulator 110, further followed by a control valve 112, and even further followed by a flow control device 114. The pressure regulator 110 sets the gas delivery pressure set point. The control valve 112 turns on and off the gas flow. The control valve 112 may be any suitable control valve, such as discussed above for control valve 103. The flow control device 114 provides the flow of gas specified by the set point of pressure regulator 110. The flow control device 114 may be any suitable flow control device, such as discussed above for flow control device 107.

In some embodiments the foreline gas injection kit 108 may further include a pressure gauge 116. The pressure gauge 116 may be disposed between the pressure regulator 110 and the flow control device 114. The pressure gauge 116 may be used to measure pressure in the kit 108 upstream of the flow control device 114. The measured pressure at the pressure gauge 116 may be utilized by a control device, such as a controller 118, discussed below, to set the pressure upstream of the flow control device 114 by controlling the pressure regulator 110.

In some embodiments, the control valve 112 may be controlled by the controller 118 to only turn gas on when the reagent from the reagent delivery system 106 is flowing, such that usage of gas is minimized. For example, as illustrated by the dotted line between control valve 103 of the reagent delivery system 106 and the control valve 112 of the kit 108, the control valve 112 may turn on (or off) in response to the control valve 103 being turned on (or off).

The foreline 102 may be coupled to a vacuum source 120 or other suitable pumping apparatus. The vacuum source 120 pumps the effluent from the processing chamber 101 to appropriate downstream effluent handling equipment, such as to a scrubber, incinerator or the like. In some embodiments, the vacuum source 120 may be a backing pump, such as a dry mechanical pump or the like. The vacuum source 120 may have a variable pumping capacity with can be set at a desired level, for example, to control or provide additional control of pressure in the foreline 102.

The controller 118 may be coupled to various components of the substrate processing system 100 to control the operation thereof. For example, the controller may monitor and/or control the foreline gas injection kit 108, the reagent delivery system 106, and/or the plasma source 104 in accordance with the teachings disclosed herein.

The embodiments of FIG. 1 are schematically represented and some components have been omitted for simplicity. For example, a high speed vacuum pump, such as a turbo molecular pump or the like, may be disposed between the processing chamber 101 and the foreline 102 for removing effluent gases from the processing chamber 101. Additionally, other variants of components may be provided to supply the foreline gas, the reagent, and/or the plasma.

In embodiments of the method disclosed herein, effluent containing undesirable material exiting from the processing chamber 101 enters the plasma source 104. An abating reagent, such as a volatilizing or condensing abating reagent, enters the plasma source 104. A plasma is generated from the abating reagent within the plasma source 104, thereby energizing the abating reagent, and in some embodiments, also energizing the effluent. In some embodiments, at least some of the abating reagent and/or material entrained in the effluent are at least partially disassociated. The identity of the abating reagent, the flow rate of the abating reagent, the foreline gas injection parameters, and the plasma generation conditions may be determined based on the composition of the material entrained in the effluent and may be controlled by the controller 118. In an embodiment where the plasma source 104 is an inductively coupled plasma source, dissociation may require several kW of power.

The abating agent may include, for example, $CH_4$, $H_2O$, $H_2$, $NF_3$, $SF_6$, $F_2$, $HCl$, $HF$, $Cl_2$, $HBr$, $O_2$, $N_2$, $O_3$, $CO$, $CO_2$, $NH_3$, $N_2O$, $CH_4$, and combinations thereof. The abating agent may also include a combination of $CH_xF_y$ and $O_2$ and/or $H_2O$, and a combination of $CF_x$ and $O_2$ and/or $H_2O$. Different abating agents may be used for treating effluent having different compositions.

Figure 2A:
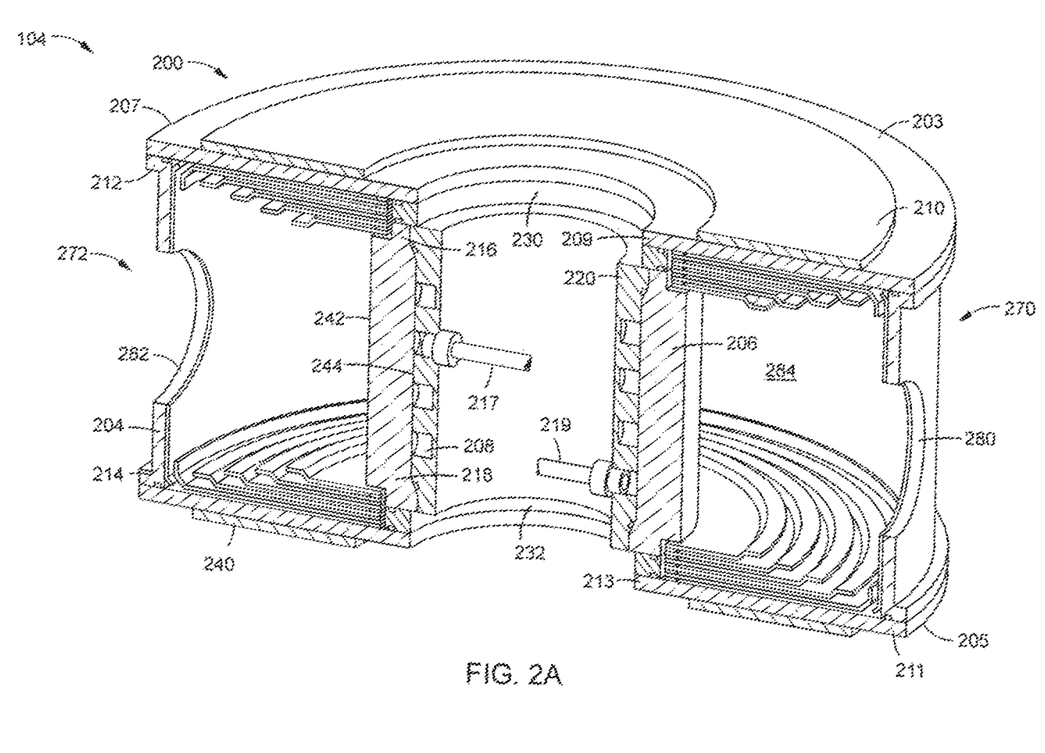
FIG. 2A is a cross sectional perspective view of the plasma source according to one embodiment.

FIG. 2A is a cross sectional perspective view of the plasma source 104 according to one embodiment. As shown in FIG. 2A, the body 200 may include an outer wall 204, an inner wall 206, a first plate 203 and a second plate 205. The first plate 203 and the second plate 205 may have a ring shape and the outer and inner walls 204, 206 may be cylindrical. The inner wall 206 may be a hollow electrode which may be coupled to an RF source (not shown). The outer wall 204 may be grounded. The first plate 203 and the second plate 205 may be concentric with the inner wall 206. The first plate 203 may have an outer edge 207 and an inner edge 209 and the second plate 205 may have an outer edge 211 and an inner edge 213. The outer wall 204 may have a first end 212 and a second end 214, and the inner wall 206 may have a first end 216 and a second end 218. A first insulating ring 230 may be disposed adjacent to the first end 216 of the inner wall 206 and a second insulating ring 232 may be disposed adjacent to the second end 218 of the inner wall 206. The insulating rings 230, 232 may be made of an insulating ceramic material. The outer edge 207 of the first plate 203 may be adjacent to the first end 212 of the outer wall 204 and the outer edge 211 of the second plate 205 may be adjacent to the second end 214 of the outer wall 204. In one embodiment, the ends 212, 214 of the outer wall 204 are in contact with the outer edges 207, 211, respectively. The inner edge 209 of the first plate 203 may be adjacent to the first insulating ring 230 and the inner edge 213 of the second plate 205 may be adjacent to the second insulating ring 232. The plasma region 284 is defined between the outer wall 204 and the inner wall 206 and between the first plate 203 and the second plate 205, and a capacitively coupled plasma may be formed in the plasma region 284.

Figure 2B:
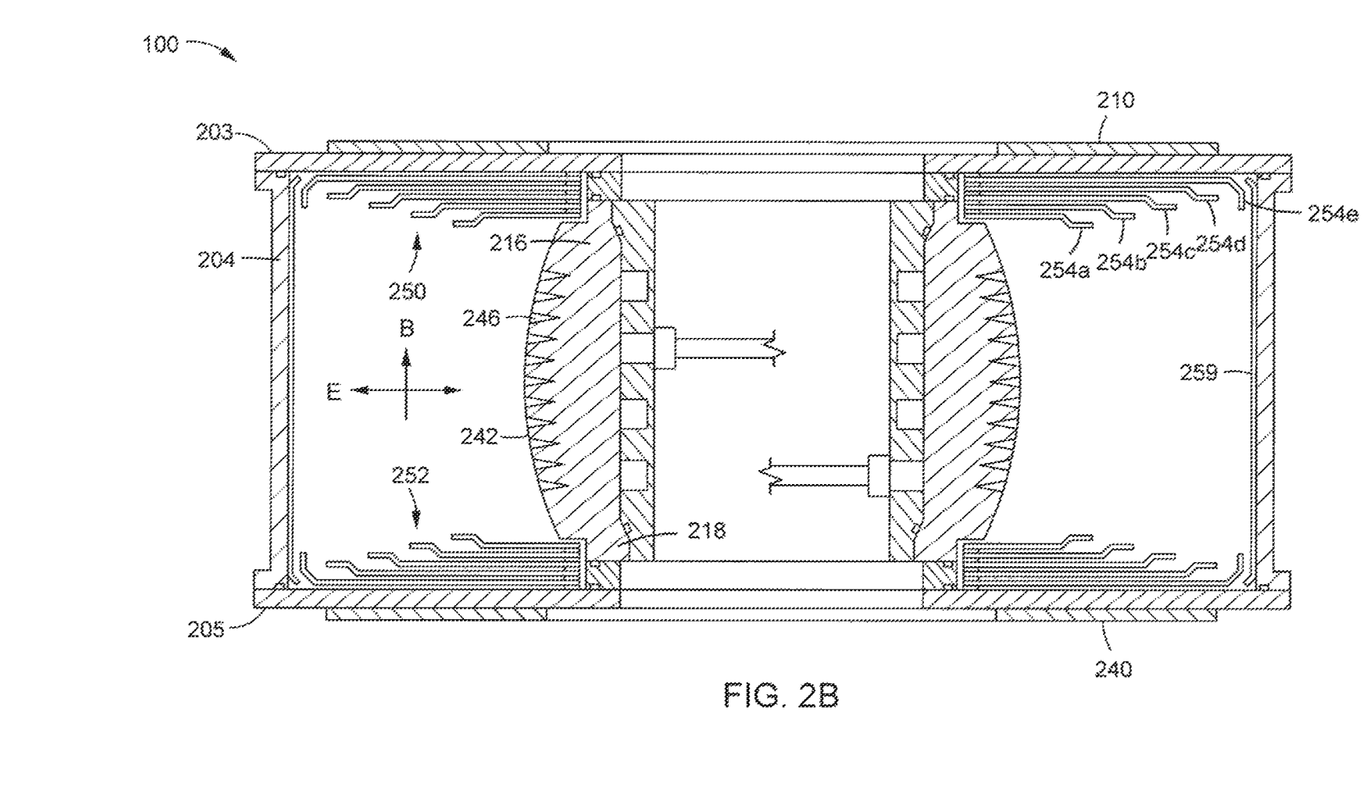
FIG. 2B is a cross sectional bottom view of the plasma source according to one embodiment.

In order to keep the inner wall 206 cool during operation, a cooling jacket 220 may be coupled to the inner wall 206. The inner wall 206 may have a first surface 242 facing the outer wall 204 and a second surface 244 opposite the first surface. In one embodiment, both surfaces 242, 244 are linear and the cooling jacket 220 is coupled to the second surface 244. In one embodiment, the first surface 242 is curved and the second surface 244 is linear, as shown in FIG. 2B. The cooling jacket 220 may have a cooling channel 208 formed therein, and the cooling channel 208 is coupled to a coolant inlet 217 and a coolant outlet 219 for flowing a coolant, such as water, into and out of the cooling jacket 220. A first plurality of magnets 210 may be disposed on the first plate 203. In one embodiment, the first plurality of magnets 210 may be a magnetron having an array of magnets and may have an annular shape. A second plurality of magnets 240 may be disposed on the second plate 205, and the second plurality of magnets 240 may be a magnetron having an array of magnets and may have the same shape as the first plurality of magnets 210. In one embodiment, the second plurality of magnets 240 is a magnetron and has an annular shape. In one embodiment, the magnets 210, 240 are linear arrays formed near the ends 270, 272. The magnets 210, 240 may have opposite polarity facing the plasma region 284. The magnets 210, 240 may be rare-earth magnets, such as neodymium ceramic magnets. One or more gas injection ports may be formed on the first plate 203 or first and second plates 203, 205, for injecting the abating agent and/or a purging gas. The purge gas may reduce deposition on shields 250, 252 (shown in FIG. 2B).

FIG. 2B is a cross sectional bottom view of the plasma source 104 according to one embodiment. As shown in FIG. 2B, the first surface 242 of the inner wall 206 has a plurality of groves 246 disposed thereon. The groves 246 may be a continuous trench. Even though the first surface 242 shown in FIG. 2B is curved, the groves 246 may be formed on the linear first surface 242, as shown in FIG. 2A. During operation, the inner wall 206 is powered by a radio frequency (RF) power source and the outer wall 204 is grounded, forming an oscillating or constant electric field "E" in the plasma region 284, depending on the type of applied power, RF or direct current (DC), or some frequency in between. Bi-polar DC and bi-polar pulsing DC power may also be used with inner and outer walls forming the two opposing electrical poles. The magnets 210, 240 create a largely uniform magnetic field "B" that is substantially perpendicular to the electric field "E." In this configuration, a resulting force causes the current that would normally follow the electric field "E" to curve towards the second end 272 (out of the paper), and this force raises the plasma density significantly by limiting plasma electron losses to the grounded wall. In the case of applied RF power, this would result in an annular oscillating current directed largely away from the grounded wall. In the case of applied DC power, this would result in a constant annular current directed largely away from the grounded wall. This effect of current divergence from the applied electric field is known as the "Hall effect." The plasma formed in the plasma region 284 dissociates at least a portion of the by-products in the effluent flowing in from the opening 280 at the first end 270 to the opening 282 at the second end 272. Abating agent may be also injected to react with the dissociated and forming less hazardous compounds. In one embodiment, the effluent contains silane, and the abating agent may be water or oxygen, which turns silane in the effluent into glass.

A first metal shield 250 may be disposed inside the plasma region 284 adjacent to the first plate 203, a second metal shield 252 may be disposed inside the plasma region 284 adjacent to the second plate 205, and a third metal shield 259 may be disposed in the plasma region adjacent to the outer wall 204. Shields 250, 252, 259 may be removable, replaceable and/or reusable since materials may be deposited thereon. The first metal shield 250 and the second metal shield 252 may have similar configuration. In one embodiment, both the first metal shield 250 and the second metal shield 252 have an annular shape. The first metal shield 250 and the second metal shield 252 each includes a stack of metal plates 254a-254e that are mutually isolated from one another. One or more gaps 276 (shown in FIG. 2A) may be formed in each metal plate 254a-254e for allowing expansion without deforming the metal plates 254a-254e.

Figure 2C:
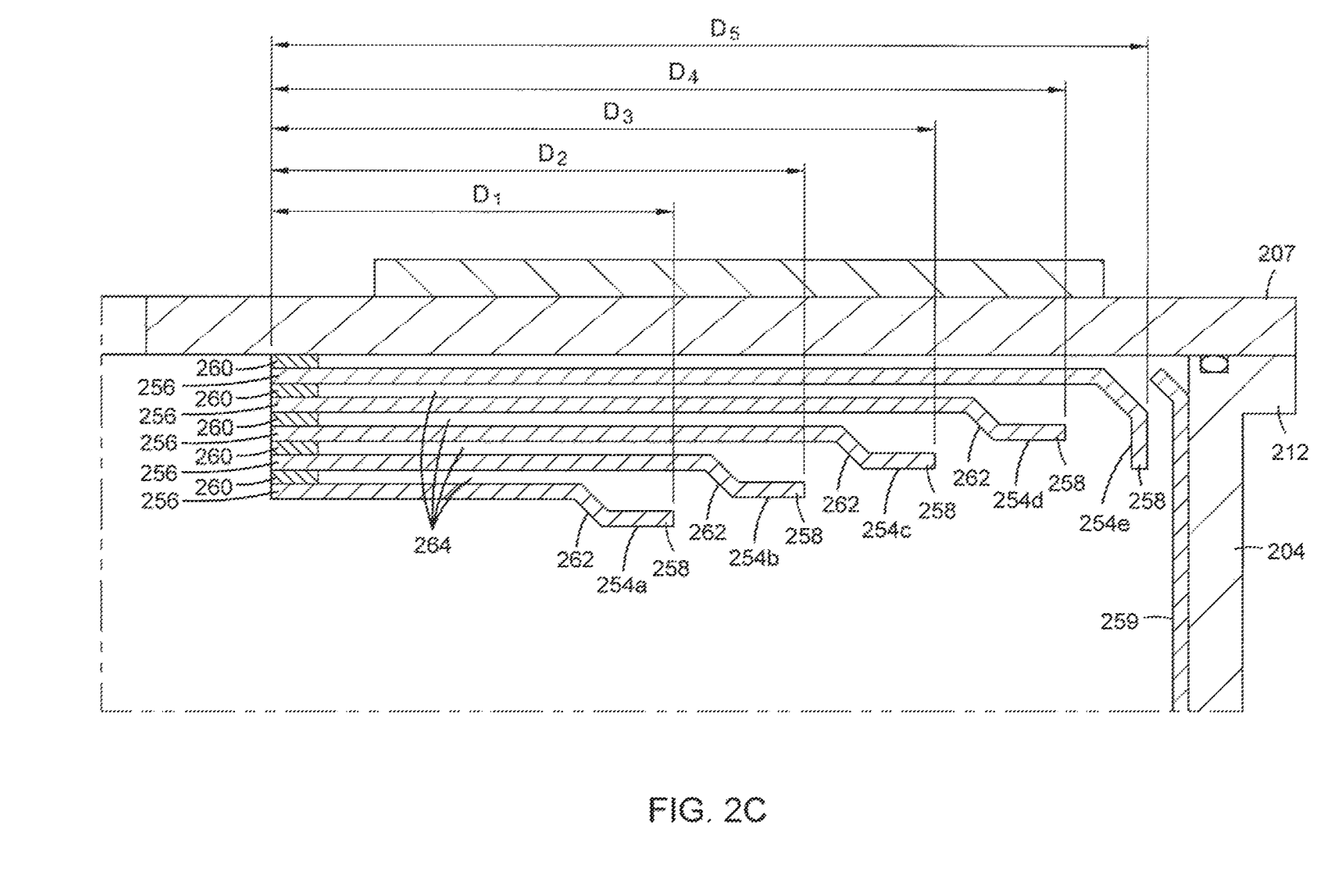
FIG. 2C is an enlarged view of a metal shield according to one embodiment.

FIG. 2C is an enlarged view of the metal shield 250 according to one embodiment. For the purpose of clarity some components of the plasma source 104 are omitted, such as the one or more gas injection ports. Each plate 254a-254e may be annular and have an inner edge 256 and an outer edge 258. The metal plates 254a-254e may be coated to change shield surface emissivity via anodization to improve chemical resistance, radiant heat transfer, and stress reduction. In one embodiment, the metal plates 254a-254e are coated with black color aluminum oxide. An inner portion 274 of the metal plate 254a may be made of a ceramic material for arcing prevention and dimensional stability. The ends 256 of the plates 254a-254e are separated from one another by an insulating washer 260, so the plates 254a-254e are mutually isolated from one another. The washer 260 also separates the plate 254e from the first plate 203. The stack of metal plates 254a-254e may be secured by one or more ceramic rods or spacers (not shown). The one or more ceramic rods may go through the stack of metal plates 254a-254e and the washers, and one end of each rod is coupled to the inner wall 206 while the other end of each rod is coupled to the first/second plate 203, 205.

In one embodiment, the distance "D1" between the inner edge 256 and the outer edge 258 of the plate 254a is smaller than the distance "D2" between the inner edge 256 and the outer edge 258 of the plate 254b, which is smaller than the distance "D3" between the inner edge 256 and the outer edge 258 of the plate 254c, which is smaller than the distance "D4" between the inner edge 256 and the outer edge 258 of the plate 254d, which is smaller than the distance "D5" between the inner edge 256 and the outer edge 258 of the plate 254e. In other words, the distance between the inner edge 256 and the outer edge 258 is related to the location of the plate, i.e., the further the plate is disposed from the plasma region 284, the greater distance between the inner edge 256 and the outer edge 258. In this configuration, the electrical voltage between the inner wall 206 and the outer wall 204 is divided by six, since there are six gaps: between the inner wall 206 and the outer edge 258 of the plate 254a, between the outer edge 258 of the plate 254a and the outer edge 258 of the plate 254b, between the outer edge 258 of the plate 254b and the outer edge 258 of the plate 254c, between the outer edge 258 of the plate 254c and the outer edge 258 of the plate 254d, between the outer edge 258 of the plate 254d and the outer edge 258 of the plate 254e, and between the outer edge 258 of the plate 254e and the outer wall 204. Each gap has a small electric potential so the electric field across the gap is small, such the area cannot light up and take the applied power, thus forcing the power to go into the plasma region 284, creating a plasma in the plasma region 284. Without the shields 250, 252 as described above, there could be a localized plasma discharge between the first end 216 of the inner wall 206 and the first end 212 of the outer wall 204 and between the second end 218 of the inner wall 206 and the second end 214 of the outer wall 204, and the plasma region 284 may not be filled with plasma.

The spaces between the metal plates 254a-254e may be dark spaces, which may be bridged with materials deposited on the plates, causing the plates to be shorted out to each other. To prevent this from happening, in one embodiment, each metal plate 254a-254e includes a step 262 so the outer edge 258 of each metal plate 254a-254e is further away from the adjacent plate. The step 262 causes the outer edge 258 to be non-linear with the inner edge 256. Each step 262 shields the dark space 264 formed between adjacent metal plates, so no material may be deposited in the dark space 264.

The outer wall 204, the inner wall 206, and the shields 250, 252, 259 may be all made of metal since metal is resistant to most chemistries used in the semiconductor processes. The type of metal used may be depending on the chemistry used in the vacuum processing chamber upstream of the plasma source 104. In one embodiment, a chlorine based chemistry is used and the metal may be stainless steel, such as 316 stainless steel. The insulating rings 230, 232 in chlorine based chemistry may be made of quartz. In another embodiment, a fluorine based chemistry is used and the metal may be aluminum and the insulating rings 230, 232 may be made of alumina. The inner wall 206 may be made of anodized aluminum or spray coated aluminum.

Figure 3:
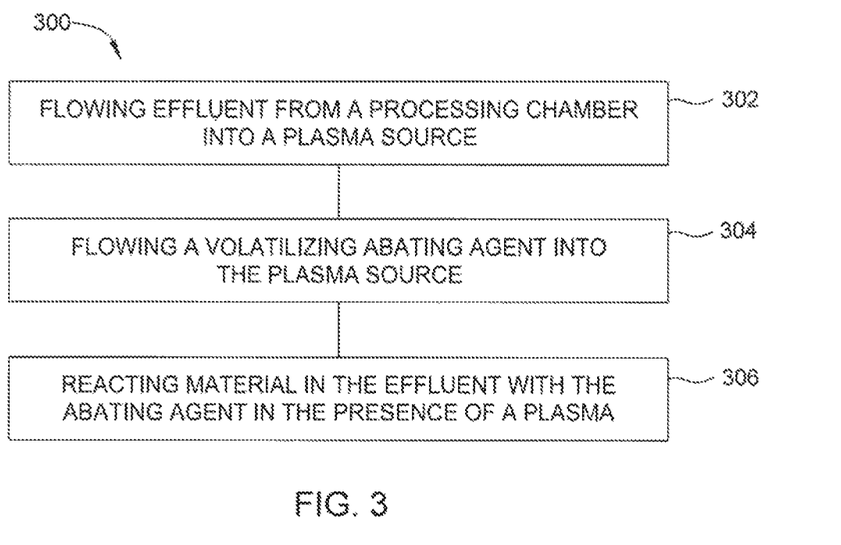
FIG. 3 is a flow diagram illustrating one embodiment of a method for abating effluent exiting a processing chamber.

FIG. 3 is a flow diagram illustrating one embodiment of a volatilizing method 300 for abating effluent exiting a processing chamber. The method 300 begins at block 302 by flowing effluent from a processing chamber, such as processing chamber 101, into a plasma source, such as plasma source 104. At block 304, a volatilizing abating reagent is flowed into the plasma source. At block 306, a plasma is generated from the volatilizing abating reagent within the plasma source, thereby energizing the abating reagent, and in some embodiments, also energizing the effluent. In some embodiments, at least some of the abating reagent and/or material entrained in the effluent are at least partially disassociated. The material in the effluent is converted to a different material in the presence of the plasma formed in the plasma source. The material in the effluent may then exit the plasma source and flow into the vacuum source, such as vacuum source 120, and/or be further treated.

In a representative volatizing abatement process using methane, methane from the reagent delivery system 106 is flowed into the plasma source 104. Effluent containing materials desired for abatement, such as Si, W, and Ti-containing compounds, is also flowed into the plasma source 104. A plasma is generated within the plasma source 104, and thereby converting the Si, W, and Ti-containing compounds into methylated compounds. The methylated compounds are volatile and more benign to human health and downstream effluent handling components than the unabated effluent. For example, exposure of effluent containing $SiO_2$ to the plasma results in the addition of four $CH_3$ groups to $SiO_2$, resulting in the production of tetramethylsilane (TMS), which can be pumped out to atmospheric pressure for further treatment. Similarly, tungstenhexafluoride present in the effluent can be methylated to form a methylated tungsten species, such as, for example, hexamethyltungsten. Methylating tungsten prevents the buildup of $WF_6$ and its by-products in pumps and vacuum lines. Likewise, titanium compounds within the effluent can be methylated to form, for example, methyltitanium trichloride, which is volatile and will not damage vacuum pumps.

In a representative volatizing abatement process using $SF_6$, $SF_6$ from the reagent delivery system 106 may be flowed into the plasma source 104. Effluent containing materials desired for abatement, such as silane ($SiH_4$), is also flowed into the plasma source 104. A plasma is generated within the plasma source 104 and thereby converts the silane to $SiF_4$, which is much more benign than the pyrophoric silane, thereby greatly improving effluent handling safety and reducing associated costs.

Figure 4:
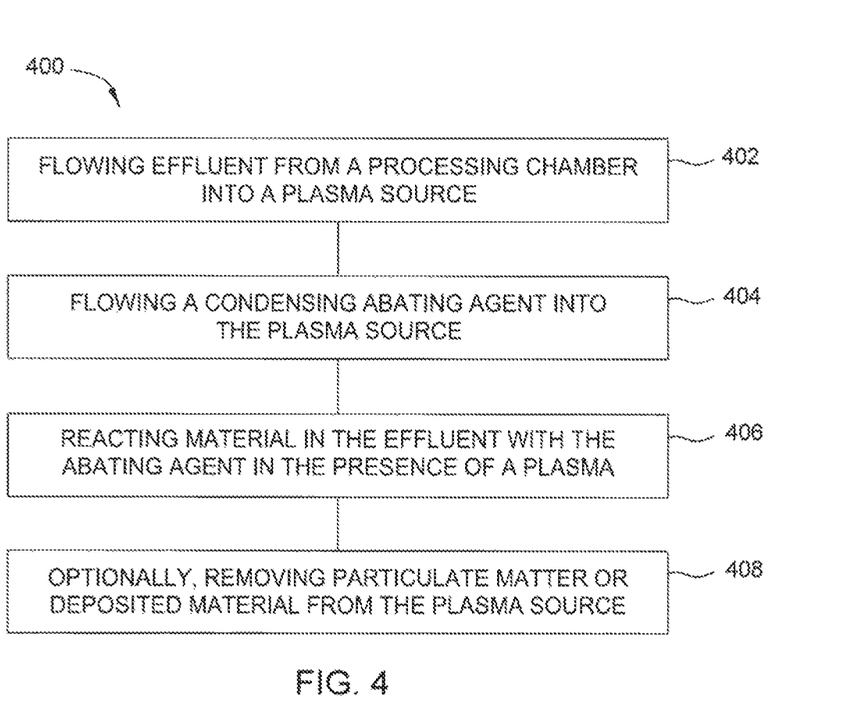
FIG. 4 is a flow diagram illustrating one embodiment of a method for abating effluent exiting a processing chamber.

FIG. 4 is a flow diagram illustrating one embodiment of a condensing method 400 for abating effluent exiting a processing chamber. The method 400 begins at block 402 by flowing effluent from a processing chamber, such as processing chamber 101, into a plasma source, such as plasma source 104. At block 404, a condensing abating reagent is flowed into the plasma source. At block 406, a plasma is generated from the condensing abating reagent within the plasma source, thereby energizing the abating reagent, and in some embodiments, also energizing the effluent. In some embodiments, at least some of the abating reagent and/or material entrained in the effluent are at least partially disassociated. The material in the effluent is converted to a different material in the presence of the plasma formed in the plasma source. The material in the effluent may then exit the plasma source and flow into the vacuum source, such as vacuum source 120, and/or be further treated. At optional block 406, the particulate matter or deposited material may be removed from the plasma source.

In a representative condensing abatement process using oxygen, oxygen from the reagent delivery system 106 is flowed into the plasma source 104. Effluent containing materials desired for abatement, such as silane ($SiH_4$) is also flowed into the plasma source 104. A plasma is generated within the plasma source 104 and thereby converts the silane to $SiO_2$ glass. The $SiO_2$ glass, which may be trapped or otherwise collected in the plasma source, is much more benign than the pyrophoric silane, thereby greatly improving effluent handling safety and reducing associated costs.

In other embodiments, condensing abating reagents and volatilizing abating reagents may be used in succession. For example, a chamber may produce effluent containing $SiH_x$ and $O_2$. When energized with a plasma, $SiH_x$ and $O_2$ tend to form a glassy $SiO_2$ material in a condensing abatement process. A subsequent process in the processing chamber may use, for example, $NF_3$, which decomposes into $NF_x$ and atomic fluorine ($F_2$). Some of the $F_2$ may be consumed in the processing chamber, but some of the $F_2$ may be evacuated unused. The unused $F_2$ may be used by the abatement system 111 to remove the condensed glassy $SiO_2$ material in a volatilizing abatement process. The volatizing abatement process may be performed by using additional volatilizing abatement reagents or by using only the $F_2$ from the effluent. Thus, in a two-part treatment process, the foreline abatement process can make efficient use of all effluent, as well as rendering the effluent safer when brought from vacuum to atmospheric pressure by the system pump. In other embodiments, a volatizing abating reagent may be used first and a condensing abating reagent may be used thereafter.

The previously described embodiments have many advantages. For example, the techniques disclosed herein can convert volatile, toxic, and/or explosive effluent into much more benign chemicals that can be more safely handled. The plasma abatement process is beneficial to human health in terms of acute exposure to the effluent by workers and by conversion of pyrophoric or toxic materials into more environmentally friendly and stable materials. The plasma abatement process also protects semiconductor processing equipment, such as, for example, vacuum pumps, from excessive wear and premature failure by removing particulates and/or other corrosive materials from the effluent stream. Moreover, performing the abatement technique on the vacuum foreline adds additional safety to workers and equipment. If an equipment leak occurs during the abatement process, the low pressure of the effluent relative to the outside environment prevents the effluent from escaping the abatement equipment. Additionally, many of the abating reagents disclosed herein are low-cost and versatile. For example, methane is inexpensive and can also methylate and thereby volatilize a wide array of metalorganic compounds. $SF_6$ is likewise versatile and low-cost. The aforementioned advantages are illustrative and not limiting. It is not necessary for all embodiments to have all the advantages.

While the foregoing is directed to embodiments of the disclosed devices, methods and systems, other and further embodiments of the disclosed devices, methods and systems may be devised without departing from the basic scope thereof, and the scope thereof is determined by the claims that follow.

What is claimed is:

1. An apparatus for abating effluent from a processing chamber, comprising:
   a plasma source coupled to a foreline of the processing chamber, the plasma source comprising:
      an outer wall;
      an inner wall, wherein the inner wall is a hollow electrode configured to be coupled to an RF source for maintaining a plasma radially outward of the inner wall and inward of the outer wall; and
   a reagent source positioned upstream of the plasma source and downstream of the processing chamber, wherein the reagent source is coupled with the plasma source, and wherein the reagent source is configured to deliver an abating reagent to the plasma source.

2. The apparatus of claim 1, wherein the abating reagent comprises one or more of $BCl_3$, $CCl_4$, $SiCl_4$, $NF_3$, $SF_4$, $SF_6$, $SF_8$, a reducing compound, a halogenated etching compound, $CH_4$, $H_2$, $F_2$, HCl, HF, $Cl_2$, HBr, $O_2$, $N_2$, $O_3$, CO, $CO_2$, $NH_3$, $N_2O$, $CH_4$, and combinations thereof.

3. The apparatus of claim 1, further comprising:
   a foreline gas injection kit positioned downstream of the plasma source and coupled to the plasma source, the foreline gas injection kit configured to deliver a gas to the foreline to control a pressure in the foreline.

4. The apparatus of claim 3, wherein the gas comprises one or more of $N_2$, Ar, and air.

5. The apparatus of claim 1, further comprising:
   a vacuum pump coupled to the processing chamber and configured to remove effluent from the processing chamber.

6. The apparatus of claim 1, the plasma source comprising:
   a first plate having an outer edge and an inner edge;
   a second plate parallel to the first plate, wherein the second plate has an outer edge and an inner edge, wherein the inner wall is disposed between the inner edge of the first plate and the inner edge of the second plate, and the first plate and the second plate are concentric with the inner wall;
   the outer wall disposed between the outer edge of the first plate and the outer edge of the second plate, the first plate, the second plate, the inner wall, and the outer wall defining a plasma region;
   a first plurality of magnets disposed on the first plate; and
   a second plurality of magnets disposed on the second plate.

7. The apparatus of claim 6, further comprising:
a cooling jacket coupled to the inner wall, the cooling jacket having a cooling channel formed therein.

8. The apparatus of claim 6, further comprising:
a first insulating ring disposed adjacent to a first end of the inner wall; and
a second insulating ring disposed adjacent to a second end of the inner wall, wherein the first end is opposed to the second end of the inner wall.

9. The apparatus of claim 6, wherein the inner wall has a first surface facing the outer wall and a second surface opposite the first surface, wherein the first surface is curved and the second surface is linear.

10. The apparatus of claim 9, wherein the first surface of the inner wall has a plurality of grooves disposed thereon.

11. An apparatus for abating effluent from a processing chamber, comprising:
a plasma source coupled to a foreline of the processing chamber, the plasma source comprising:
an outer wall;
an inner wall, wherein the inner wall is a hollow electrode configured to be coupled to an RF source for maintaining a plasma radially outward of the inner wall and inward of the outer wall; and
a reagent source positioned upstream of the plasma source and downstream of the processing chamber, wherein the reagent source is coupled with the plasma source, and wherein the reagent source is configured to deliver an abating reagent to the plasma source; and
a flow control device disposed between the foreline and the reagent source.

12. The apparatus of claim 11, wherein the flow control device is configured to control a flow rate of the abating reagent to the plasma source.

13. The apparatus of claim 11, further comprising:
an inlet port of the foreline positioned downstream of the plasma source and configured to deliver a gas to the foreline to control a pressure in the foreline.

14. The apparatus of claim 11, the plasma source comprising:
a first plate having an outer edge and an inner edge;
a second plate parallel to the first plate, wherein the second plate has an outer edge and an inner edge, wherein the inner wall is disposed between the inner edge of the first plate and the inner edge of the second plate and the first plate and the second plate are concentric with the inner wall;
an outer wall disposed between the outer edge of the first plate and the outer edge of the second plate, the first plate, the second plate, the inner wall, and the outer wall defining a plasma region;
a first plurality of magnets disposed on the first plate; and
a second plurality of magnets disposed on the second plate.

15. The apparatus of claim 14, further comprising:
a first insulating ring disposed adjacent to a first end of the inner wall; and
a second insulating ring disposed adjacent to a second end of the inner wall, wherein the first end is opposed to the second end of the inner wall.

16. The apparatus of claim 14, further comprising:
a cooling jacket coupled to the inner wall, the cooling jacket having a cooling channel formed therein.

* * * * *

UNITED STATES PATENT AND TRADEMARK OFFICE
CERTIFICATE OF CORRECTION

PATENT NO. : 11,185,815 B2
APPLICATION NO. : 16/030337
DATED : November 30, 2021
INVENTOR(S) : Cox et al.

It is certified that error appears in the above-identified patent and that said Letters Patent is hereby corrected as shown below:

In the Specification

In Column 4, Line 16, delete "($Si_2Cl_4$),") and insert -- ($Si_2Cl_6$), --, therefor.

In Column 7, Line 26, delete "$CH_4$." and insert -- $CH_4$, --, therefor.

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*